(12) United States Patent
Dingman

(10) Patent No.: US 6,943,292 B2
(45) Date of Patent: Sep. 13, 2005

(54) PRINTED CIRCUIT BOARD STIFFENER

(75) Inventor: Michael Allan Dingman, Davison, MI (US)

(73) Assignee: Siemens VDO Automotive Corporation, Auburn Hills ( * ) Notice: Subject to any disclaimer, the term of this patent is extended or adjusted under 35 U.S.C. 154(b) by 0 days.

(21) Appl. No.: 10/757,922

(22) Filed: Jan. 14, 2004

(65) Prior Publication Data

US 2004/0252476 A1 Dec. 16, 2004

Related U.S. Application Data

(60) Provisional application No. 60/469,799, filed on May 12, 2003.

(51) Int. Cl.[7] ............................. H02G 3/08; H05K 5/00
(52) U.S. Cl. ....................... 174/52.1; 361/752; 361/809
(58) Field of Search ..................... 174/52.1; 361/807, 361/809, 810, 752; 439/76.1, 76.2

(56) References Cited

U.S. PATENT DOCUMENTS

| | | | | |
|---|---|---|---|---|
| 4,159,506 A | * | 6/1979 | Latasiewicz et al. | 361/753 |
| 4,533,978 A | * | 8/1985 | Walter | 361/809 |
| 4,988,577 A | * | 1/1991 | Jamieson | 428/573 |
| 5,136,470 A | * | 8/1992 | Sheridon et al. | 361/749 |
| 5,198,279 A | * | 3/1993 | Beinhaur et al. | 428/99 |
| 5,490,038 A | * | 2/1996 | Scholder et al. | 361/759 |
| 6,122,815 A | * | 9/2000 | Kownacki et al. | 29/426.1 |
| 6,260,265 B1 | * | 7/2001 | Kownacki et al. | 29/846 |
| 6,362,968 B1 | * | 3/2002 | Lajara et al. | 361/752 |
| 6,512,678 B2 | * | 1/2003 | Sims et al. | 361/759 |
| 6,717,051 B2 | * | 4/2004 | Kobayashi et al. | 174/52.1 |
| 6,771,517 B2 | * | 8/2004 | Caprisi et al. | 361/829 |
| 6,884,117 B2 | * | 4/2005 | Korsunsky et al. | 439/607 |
| 2002/0141165 A1 | * | 10/2002 | Sims et al. | 361/752 |
| 2005/0037640 A1 | * | 2/2005 | Messina et al. | 439/71 |

* cited by examiner

*Primary Examiner*—Hung V. Ngo

(57) ABSTRACT

A printed circuit board (PCB) assembly includes a stiffener member that eliminates the need for a separate PCB housing. The stiffener member is attached to the PCB at a first mount interface without the use of fasteners and is attached to a vehicle structure at a second mount interface. The first mount interface comprises a plurality of mounting feet that extend out transversely relative to a stiffener main body portion, and which are soldered directly to the PCB. The second mount interface comprises a plurality of radially extending tabs formed about the circumference of the stiffener member. The tabs each include an aperture for receiving a fastener. The stiffener member also includes gripping elements that resiliently engage electrical components mounted to the PCB to securely hold the electrical component in place and to reduce vibrations.

19 Claims, 2 Drawing Sheets

PRINTED CIRCUIT BOARD STIFFENER

RELATED APPLICATIONS

The application claims priority to U.S. Provisional Application No. 60/469,799, which was filed on May 12, 2003.

BACKGROUND OF THE INVENTION

The subject invention generally relates to a printed circuit board (PCB) assembly that eliminates the need for a stiff structure for the PCB housing by mounting a stiffener board directly to the PCB.

Conventional designs for vehicle sensor assemblies, such as safety restraint modules for example, required a very stiff housing unit for a printed circuit board (PCB). The stiff housing unit is required to provide accurate transmission of crash signals from a vehicle to sensors mounted on the PCB. Further, the housing unit supports the PCB in such a manner that the sensors are prevented from receiving false crash signals caused by standard vehicle vibrations. The housing unit also includes an electromagnetic interference (EMI) wall that prevents adjacent electrical systems from interfering with the operation of the PCB.

Traditionally, a plurality of mounting components are needed to secure the PCB to the housing unit and to secure the housing unit to a vehicle structure. A typical configuration requires a plurality of screws to fasten the PCB to the housing unit. Screws are also required to attach a cover to the housing unit. The housing unit is mounted to the vehicle with a bracket assembly. Screws are required to attach the housing to the bracket assembly and are required to attach the bracket assembly to the vehicle.

This configuration has several disadvantages. The numerous additional mounting components increase the possibility that the PCB will not be properly secured within the housing unit. If the PCB is not properly secured or if the screws loosen over time, system accuracy decreases because crash signals will not be properly received by the sensors mounted on the PCB. Further, these additional mounting components increase the overall component cost, manufacturing cost, and assembly time for the system.

Accordingly, there is a need for a more efficient method and apparatus for securing a PCB and sensor assembly to a vehicle, which provides adequate protection for sensors and reduces overall vibrations, as well as overcoming the other above-mentioned deficiencies in the prior art.

SUMMARY OF THE INVENTION

A printed circuit board assembly for a vehicle sensor includes a stiffener board that is attached to a printed circuit board (PCB) without requiring any fasteners. The stiffener board is directly attached to a vehicle structure without requiring a stiff PCB housing or associated bracket assembly.

In one disclosed embodiment, the PCB includes at least one sensor that is in communication with a safety restraint control device, such as an airbag module, for example. When the vehicle is subjected to an impact event, the sensor measures a vehicle condition and transmits a signal representative of the condition to the control device. The control device then determines whether or not to deploy the safety restraint device.

In one disclosed embodiment, the stiffener board is attached to the PCB at a first mount interface and is attached to the vehicle structure at a second mount interface. The first mount interface preferably comprises a plurality of mounting feet extending transversely relative to a main body portion of the stiffener board. Each of the mounting feet are soldered to the PCB. The second mount interface preferably comprises a plurality of radially extending tabs formed about the circumference of the main body portion. Each tab includes an aperture for receiving a fastener. The second mount interface provides the sole attachment interface to the vehicle structure for both the PCB and the stiffener board.

The subject invention provides a PCB assembly that eliminates the need for a stiff PCB housing, bracket assembly, and a large portion of the mounting hardware traditionally required for mounting a PCB assembly to a vehicle structure. This significantly reduces cost and assembly time along with increased performance of the module by reducing factors that affect the signal performance.

These and other features of the present invention can be best understood from the following specification and drawings, the following of which is a brief description.

DETAILED DESCRIPTION OF THE PREFERRED EMBODIMENT

Figure 1:
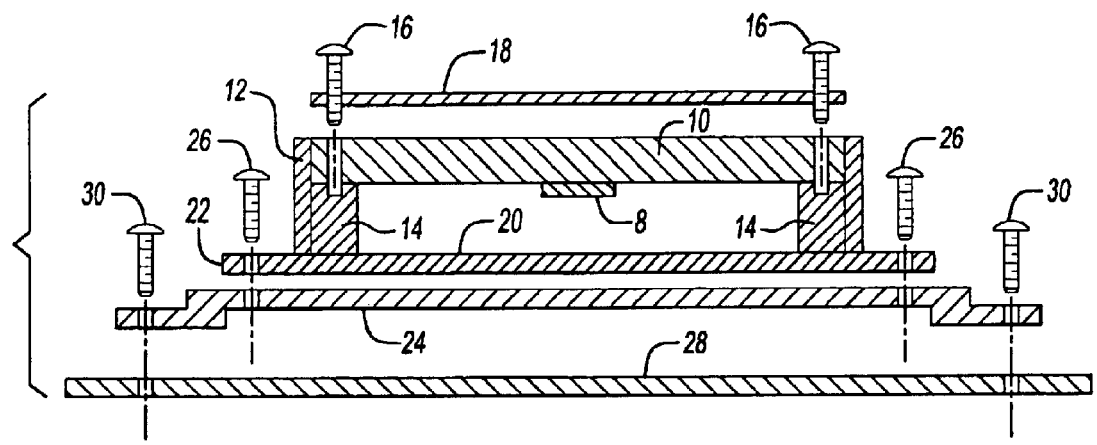
FIG. 1 is a schematic view of a prior art PCB assembly.

A prior art printed circuit board (PCB) assembly is shown in FIG. 1. The assembly includes a sensor 8 supported on a PCB 10, which is mounted within a PCB housing 12. The PCB housing 12 includes a pair of support walls 14 that support a bottom portion of the PCB 10. A first set of screws 16 mount the PCB 10 to the PCB housing 12. The screws 16 extend through the PCB 10 and into the support walls 14. A cover 18 is positioned over the PCB 10 to enclose the PCB 10 within the PCB housing 12. The first set of screws 16 also secures the cover 18 to the PCB housing 12.

The PCB housing 12 includes a base portion 20 with a circumferential mounting flange 22. The PCB housing 12 is mounted to a bracket 24 via the mounting flange 22 with a second set of screws 26. The bracket 24 is mounted to a vehicle floor 28 with a third set of screws 30. This traditional configuration requires at least three fastener interfaces, requiring three sets of screws, as wells as requiring a housing, cover, and bracket assembly.

Figure 2:
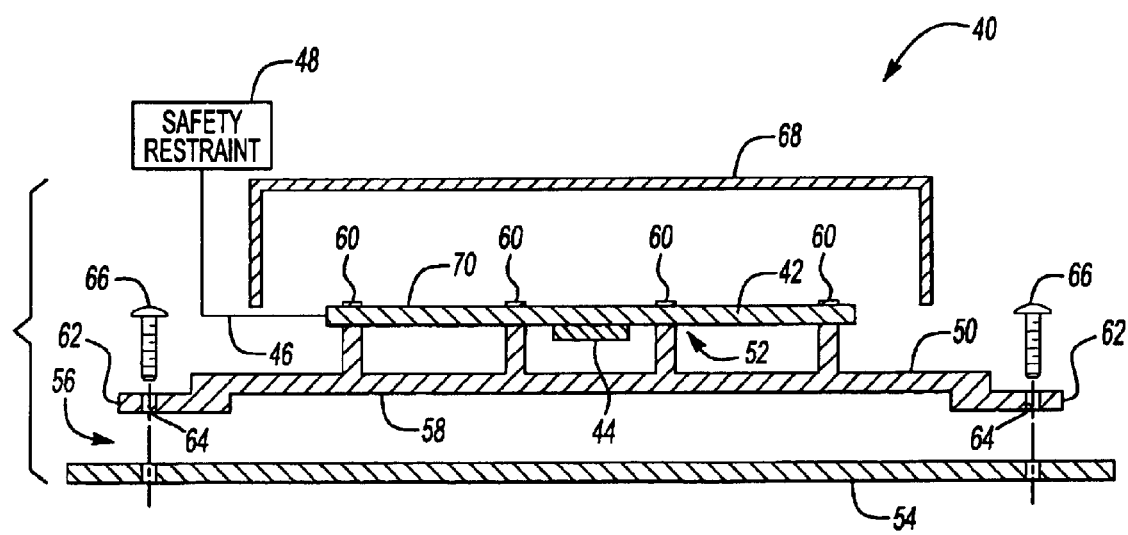
FIG. 2 is an exploded schematic view of a PCB assembly incorporating the subject invention.

A unique PCB assembly, which requires fewer components and which is more efficient to assemble, is shown generally at 40 in FIG. 2. The assembly 40 includes a PCB 42, which supports at least one sensor 44. The sensor 44 is preferably an accelerometer sensor, however, any other know type of sensor could also be mounted to the PCB 42. The sensor 44 generates a signal 46 representative of a vehicle characteristic in response to a vehicle impact or crash event. The signal 46 is transmitted to a safety restraint device control module 48. The control module 48 then determines whether or not to deploy an associated safety restraint device.

The assembly 40 includes a stiffener board 50 that is fixed to the PCB 42 at a first mounting interface 52 without requiring the use of fasteners. The stiffener board 50 is fixed to a vehicle structure 54 at a second mounting interface 56. The stiffener board 50 includes a main body portion 58 that is generally flat. The stiffener board 50 is preferably made from steel, aluminum, or any other material that provides for appropriate rigidity, and which can conduct crash signals between the PCB 42 the vehicle. Further, the stiffener board 50 can be manufactured by a stamping process, casting process, or any other known process.

The first mounting interface 52 preferably comprises a plurality of mounting feet 60 that extend transversely relative to the main body portion 58 and toward the PCB 42. Preferably, the mounting feet 60 are orientated ninety degrees relative to the main body portion 58. Each of the mounting feet 60 are spaced apart from each other and are wave or selective soldered to the PCB 42. Soldering operations preferably occur subsequent to in-circuit testing of the PCB 42.

The second mounting interface 56 preferably comprises a plurality of radially extending tabs 62 that are formed about the circumference of the stiffener board 50. The sensor 44 is preferably positioned on the PCB 42 between the tabs 62 of the stiffener board 50. Each of the tabs 62 includes an aperture 64 that receives a fastener 66. The fasteners 66 provide the sole attachment to the vehicle structure 54 for both the PCB 42 and the stiffener board 50.

A cover 68 is optionally used to cover an exposed side 70 of the PCB 42. In one embodiment, the cover 68 comprises an overmolded module that extends from an edge of the stiffener board 50.

Figure 3:
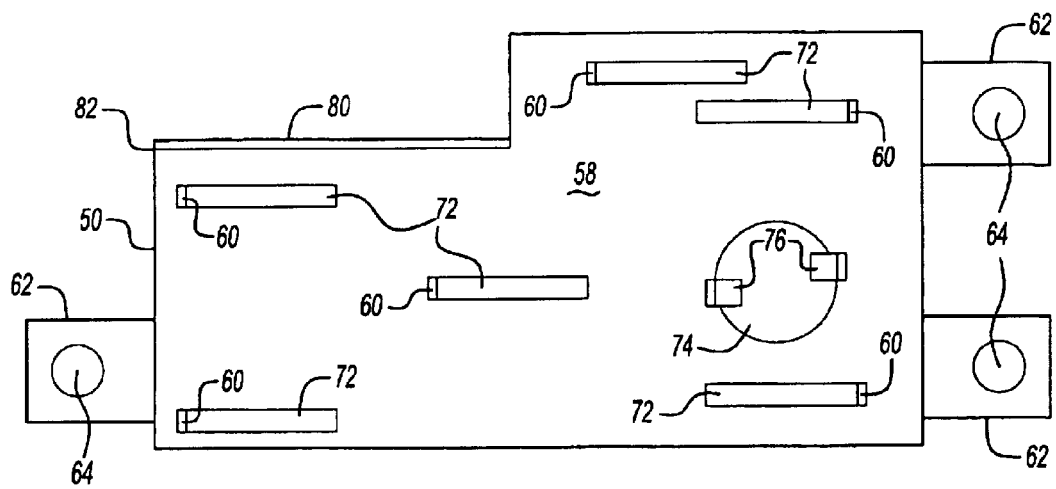
FIG. 3 is a top view of a stiffener board as used in the assembly of FIG. 2.

As shown in FIG. 3, the mounting feet 60 extend from a plurality of tab portions 72 that are positioned at various locations on the main body portion 58. The tab portions 72 are positioned approximate to the sensor 44 to provide an enhanced communication path for impact signals transmitted from the vehicle to the PCB 42. The tab portions 72 are also positioned so that the stiffener board 50 provides a communication path to a ground source, such as the vehicle. As a result, large ground traces traditionally found on the PCB are eliminated.

The mounting feet 60 extend from the tab portions 72 to provide for secure mounting of the PCB 42 at a plurality of mounting locations on the PCB 42. Accordingly, the stiffener board 50 secures the PCB 42 so that vibrations do not affect operation of the PCB 42. Further, the various positions of the mounting feet 60 are preferably optimized relative to each other to increase rigidity of the PCB 42, resulting in minimized vibrations.

Figure 4:
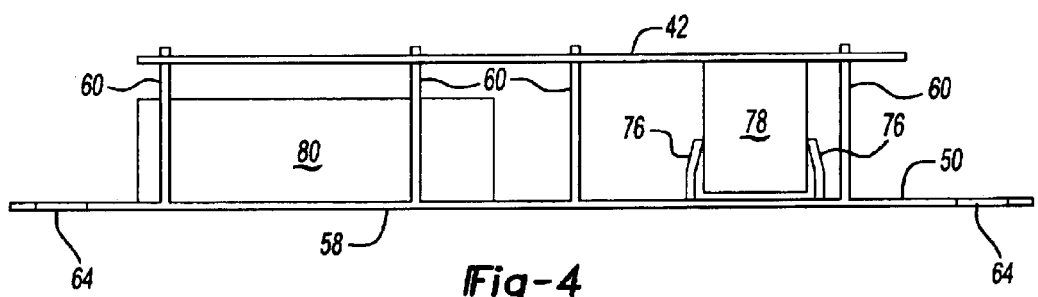
FIG. 4 is a side view of a PCB assembly incorporating the stiffener board of FIG. 3.
Figure 5:
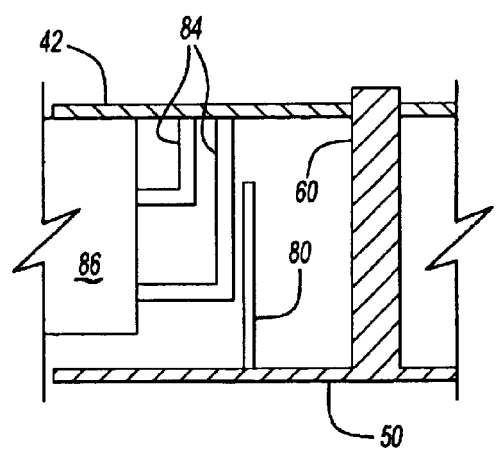
FIG. 5 is an end view, partially broken away, of the PCB assembly shown in FIG. 4.

The stiffener board 50 preferably includes at least one large sized aperture 74 with at least one gripping element 76 (see FIG. 4) positioned adjacent to the aperture 74. The aperture 74 is sized and positioned to receive an electrical component 78 that extends downwardly from the PCB 42 toward the stiffener board 50. An example of one type of electrical component 78, is a large electrolytic capacitor. The gripping element 76 resiliently engages the electrical component 78 to securely hold the component 78 in place, which in turn reduces vibrations. Preferably, multiple gripping elements 76 are used. An example of one type of gripping element 76 is a spring clip, however, other types of gripping elements could also be used.

The stiffener board 50 can optionally include an electromagnetic interference (EMI) wall 80. The EMI wall 80 preferably extends from an edge 82 of the stiffener board 50 toward the PCB 42. The EMI wall 80 prevents extraneous electrical static from adjacent electrical systems from interfering with the operation of the PCB 42. The EMI wall 80 is preferably formed by bending a portion of the edge 82 of the stiffener board 50. The EMI wall 80 is preferably positioned adjacent to connector pins 84 supported on a connector 86, which connects a vehicle system controller (not shown) or the control module 48 to the PCB 42.

The subject invention provides a unique and efficient method and apparatus for transmitting crash signals from a vehicle to sensors 44 that are mounted to a PCB 42. This is accomplished by mounting the stiffener board 50 directly to the PCB 42, which in turn is mounted directly to the vehicle structure 54. Directly attaching a stiffener board 50 to the PCB 42 eliminates the need for using a conventional PCB housing to transmit crash signals from the vehicle to the sensors 44. Thus, the present invention eliminates a large number of mounting components, lowers expense, and decreases the risk of failed housing and PCB attachment interfaces.

Further, the present invention does not require the use of a housing with an EMI wall. Also, because the PCB 42 can optionally include an overmolding module, the need for a metal or plastic cover for a traditional PCB housing is eliminated. Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A printed circuit board assembly for a vehicle sensor comprising:
    a printed circuit board; and
    a stiffener board including a first mounting portion attached to a vehicle structure and a second mounting portion attached to said printed circuit board wherein said stiffener board is positioned between said printed circuit board and said vehicle structure and wherein said stiffener board is attached to said printed circuit board without fasteners.

2. The assembly of claim 1 wherein said stiffener board includes a generally flat main body portion with said second mounting portion extending transversely to said main body portion.

3. The assembly of claim 2 wherein said second mounting portion comprises a plurality of mounting feet extending outwardly from said main body portion toward said printed circuit board with each of said mounting feet being spaced apart from one another.

4. The assembly of claim 3 wherein said mounting feet are soldered to said printed circuit board.

5. The assembly of claim 2 wherein said first mounting portion comprises a plurality of tabs extending outwardly about the circumference of said main body portion with each of said tabs being fixed to said vehicle structure to provide sole attachment of said stiffener board and said printed circuit board to said vehicle structure.

6. The assembly of claim 5 wherein said tabs each include an aperture and wherein said tabs are directly attached to said vehicle structure with a plurality of fasteners with one fastener being received in each one of said apertures.

7. A printed circuit board assembly for a vehicle sensor comprising:
    a printed circuit board;
    a stiffener board including a first mounting portion attached to a vehicle structure and a second mounting portion attached to said printed circuit board wherein said stiffener board is positioned between said printed circuit board and said vehicle structure; and wherein said printed circuit board includes at least one electrical component extending toward said stiffener board and wherein said stiffener board includes at least one gripping element for engagement with said electrical component to securely hold said electrical component in place.

8. A printed circuit board assembly for a vehicle sensor comprising:
  a printed circuit board; and
  a stiffener board including a first mounting portion attached to a vehicle structure and a second mounting portion attached to said printed circuit board wherein said stiffener board is positioned between said printed circuit board and said vehicle structure and wherein said stiffener board includes a transversely extending electromagnetic interference wall positioned adjacent connector pins for said printed circuit board.

9. A printed circuit board assembly for a vehicle sensor comprising:
  a printed circuit board;
  a stiffener board including a first mounting portion attached to a vehicle structure and a second mounting portion attached to said printed circuit board wherein said stiffener board is positioned between said printed circuit board and said vehicle structure; and
  a cover mounted along edges of said stiffener board to substantially enclose said printed circuit board between said cover and said stiffener board.

10. A vehicle sensor assembly for a safety restraint module comprising:
  a printed circuit board supporting at least one sensor;
  a stiffener board attached to said printed circuit board without fasteners, said stiffener board including a first mounting portion fixed to a vehicle structure and a second mounting portion attached to said printed circuit board wherein said first mounting portion provides for sole attachment of said printed circuit board and said stiffener board to said vehicle structure.

11. The assembly of claim 10 wherein said second mounting portion comprises a plurality of tabs spaced apart from each other along a main body portion, with each of said tabs including a mounting foot extending outwardly toward said printed circuit board.

12. The assembly of claim 11 wherein each mounting foot is soldered to said printed circuit board.

13. The assembly of claim 12 wherein said first mounting portion comprises a plurality of radially extending tabs spaced about the circumference of said main body portion wherein each of said radially extending tabs includes an aperture for receiving a fastener.

14. The assembly of claim 10 wherein said printed circuit board includes at least one electrical component extending toward said stiffener board and wherein said stiffener board includes at least one aperture and a plurality of spring clips adjacent said aperture for resiliently engaging said electrical component to securely hold said electrical component in place.

15. The assembly of claim 10 wherein said sensor comprises an accelerometer that generates a crash signal that is transmitted to a safety restraint control unit.

16. A method for securing a printed circuit board to a vehicle structure comprising the steps of:
  (a) securing a stiffener board to a printed circuit board at a first mount interface without using fasteners; and
  (b) mounting the stiffener board to a vehicle structure at a second mount interface that is different from the first mount interface.

17. The method of claim 16 including the step of providing sole attachment of the stiffener board and printed circuit board to the vehicle structure by fastening only the stiffener board to the vehicle structure at the second mount interface.

18. The method of claim 17 including the steps of forming mounting feet on the stiffener board and soldering the mounting feet to the printed circuit board to define the first mount interface.

19. The method of claim 16 including the step of bending an edge of the stiffener board to form an electromagnetic interference wall portion.

* * * * *